(12) United States Patent
Lin et al.

(10) Patent No.: US 8,256,111 B2
(45) Date of Patent: Sep. 4, 2012

(54) CIRCUIT BOARD LAYOUT METHOD

(75) Inventors: Yu-Hsu Lin, Santa Clara, CA (US);
Jeng-Da Wu, Taipei Hsien (TW);
Chih-Hang Chao, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 151 days.

(21) Appl. No.: 12/645,303

(22) Filed: Dec. 22, 2009

(65) Prior Publication Data

US 2010/0096170 A1    Apr. 22, 2010

Related U.S. Application Data

(63) Continuation-in-part of application No. 11/737,147, filed on Apr. 19, 2007, now Pat. No. 7,663,063.

(30) Foreign Application Priority Data

Dec. 22, 2006   (CN) .......................... 2006 1 0157882

(51) Int. Cl.
*H05K 3/02* (2006.01)
*H05K 3/10* (2006.01)
(52) U.S. Cl. .............. 29/846; 29/842; 29/831; 174/254; 174/255; 174/260
(58) Field of Classification Search .................... 29/842, 29/846, 831; 174/254, 255, 260
See application file for complete search history.

(56) References Cited

U.S. PATENT DOCUMENTS

| 5,360,949 | A | * | 11/1994 | Duxbury | 174/250 |
| 6,184,478 | B1 | * | 2/2001 | Imano et al. | 174/261 |
| 2006/0144616 | A1 | | 7/2006 | Lin et al. | |
| 2008/0151521 | A1 | | 6/2008 | Lin et al. | |

FOREIGN PATENT DOCUMENTS

| EP | 1720384 A2 | | 11/2006 |
| EP | 1720384 A2 | * | 11/2006 |
| JP | 6326476 A | | 11/1994 |
| JP | 7321463 A | | 12/1995 |
| JP | 2000114722 A | | 4/2000 |
| WO | 2007099596 A1 | | 9/2007 |

* cited by examiner

*Primary Examiner* — Derris Banks
*Assistant Examiner* — Jeffrey T Carley
(74) *Attorney, Agent, or Firm* — Altis Law Group, Inc.

(57) ABSTRACT

A method for laying out a circuit board includes following steps. A substrate board is formed with a plurality of board sides. A ground plane, including a plurality of tiles, is provided. Each ground trace tile is defined by a plurality of ground traces. A signal plane on the substrate board has a plurality of signal traces that comprise of a plurality of straight line segments. Any one ground trace of each tile is arranged at an angle other than zero degrees relative to one determined board side. The straight line segments is applied to be mapped on the ground plane crossing one ground trace of one tile within an angle range determined by the ground traces of the tile and an adjacent diagonal line of the tile. The one ground trace and the straight line segments are applied at an angle movable in a range from 22.5° to 32.5°.

8 Claims, 13 Drawing Sheets

CIRCUIT BOARD LAYOUT METHOD

CROSS-REFERENCE

This is a Continuation-in-Part case of the U.S. patent application Ser. No. 11/737,147 filed on Apr. 19, 2007 and entitled "CIRCUIT BOARD WITH IMPROVED GROUND PLANE".

BACKGROUND

1. Technical Field

The disclosure relates to circuit boards and layout methods, particularly to a circuit board with an improved ground plane and a method for laying out such a circuit board.

2. Description of Related Art

Circuit boards such as printed circuit boards (PCBs) are widely used in conventional electronic devices. In design of a contemporary PCB, trace impedance control is very important. The impedance relates to a number of parameters, such as the widths and distances of signal traces, and the thicknesses of media layers of the PCB. For example, in a circuit board including a signal plane for signal traces arranged thereon and a ground plane for ground traces arranged thereon, a media layer is disposed between the signal plane and the ground plane. Often, the media layer is thin enough that the impedance of the signal traces is affected, deteriorating signal quality of the circuit board.

What is needed, therefore, is a circuit board having sufficient signal trace impedance for improving signal quality.

BRIEF DESCRIPTION OF THE DRAWINGS

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
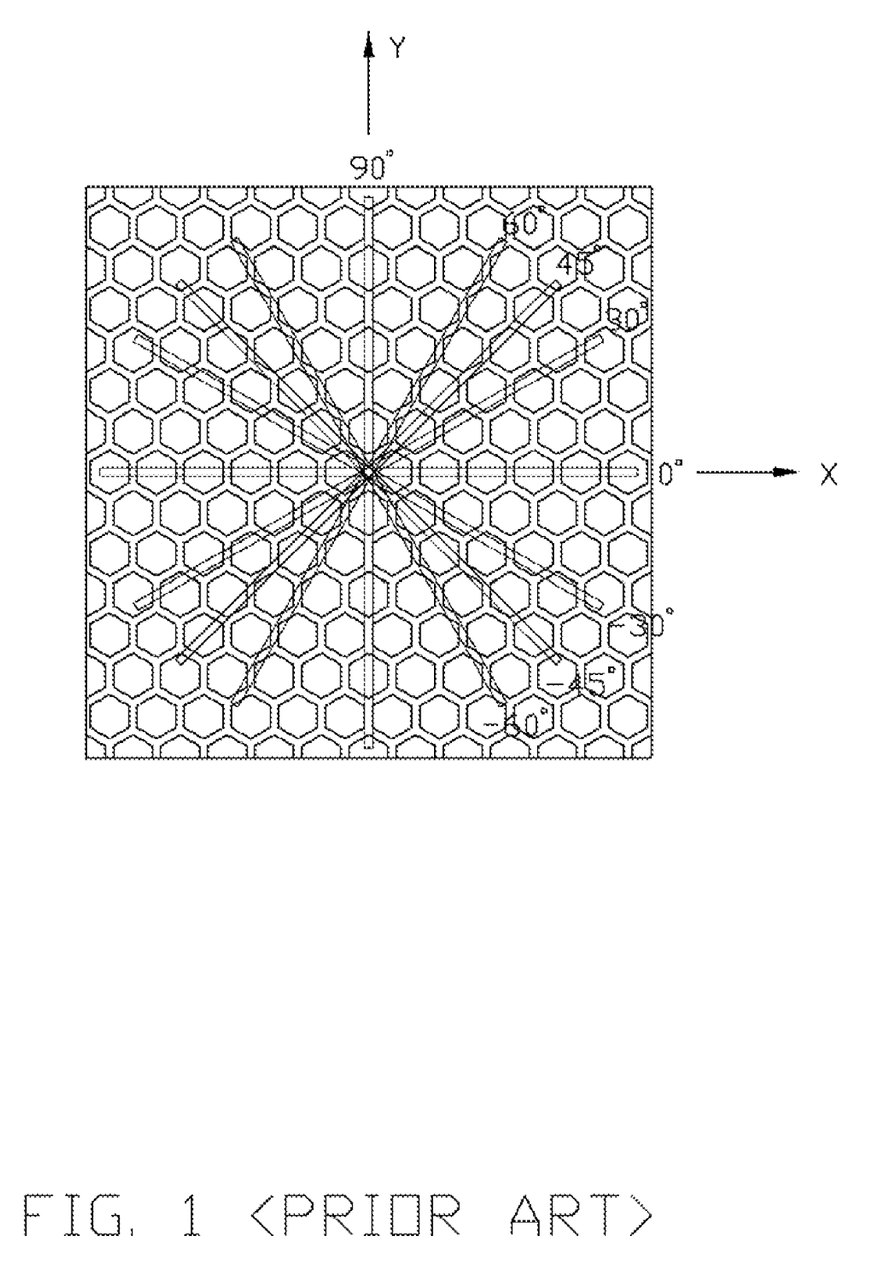
FIG. 1 is a top view of one embodiment of a circuit board, according to the prior art, with a conventional ground plane, and with straight line segments of signal traces mapped thereon.
Figure 2:
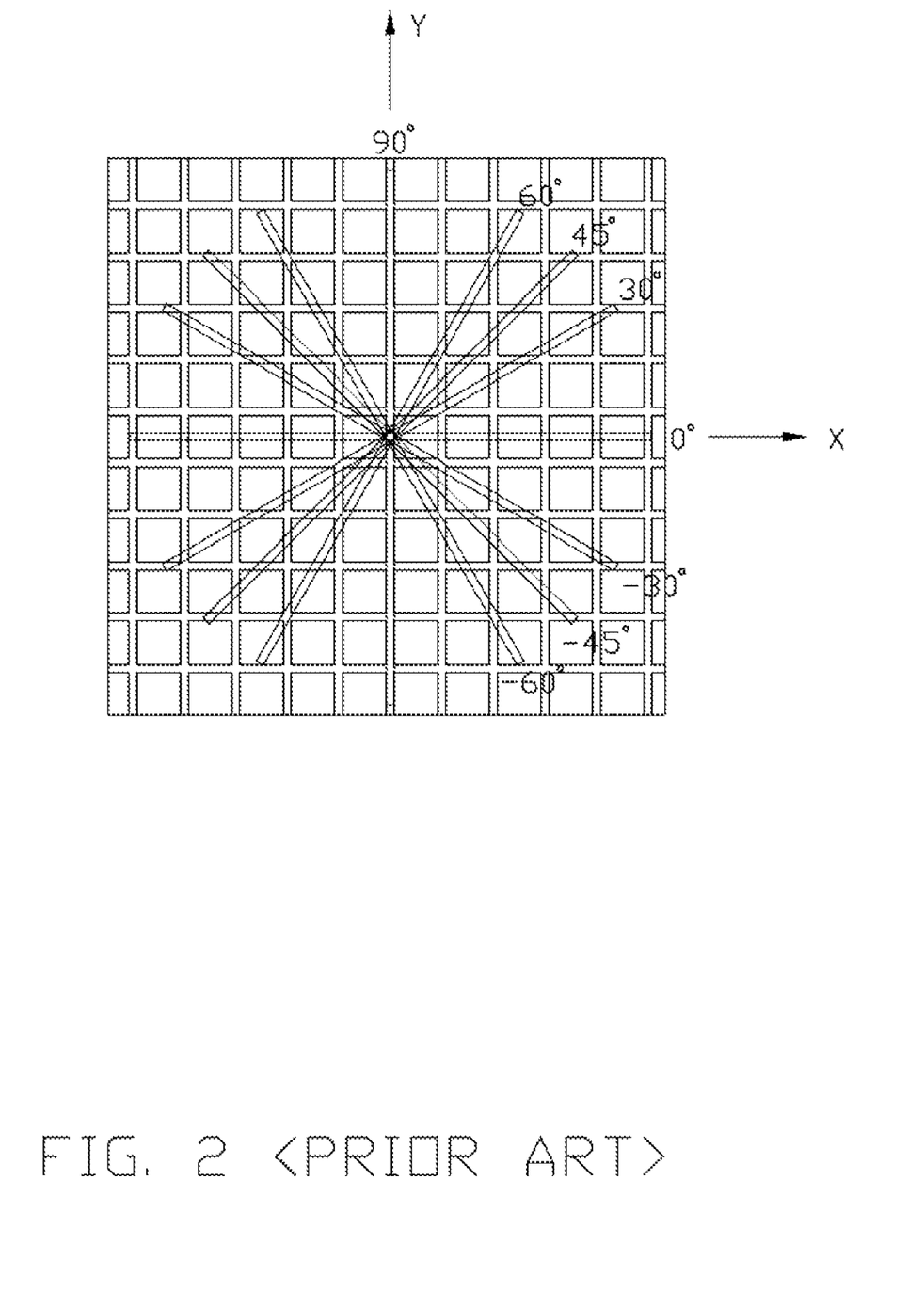
FIG. 2 is a top view of one embodiment of a circuit board, according to the prior art, with a conventional ground plane, and with straight line segments of signal traces mapped thereon.
Figure 3:
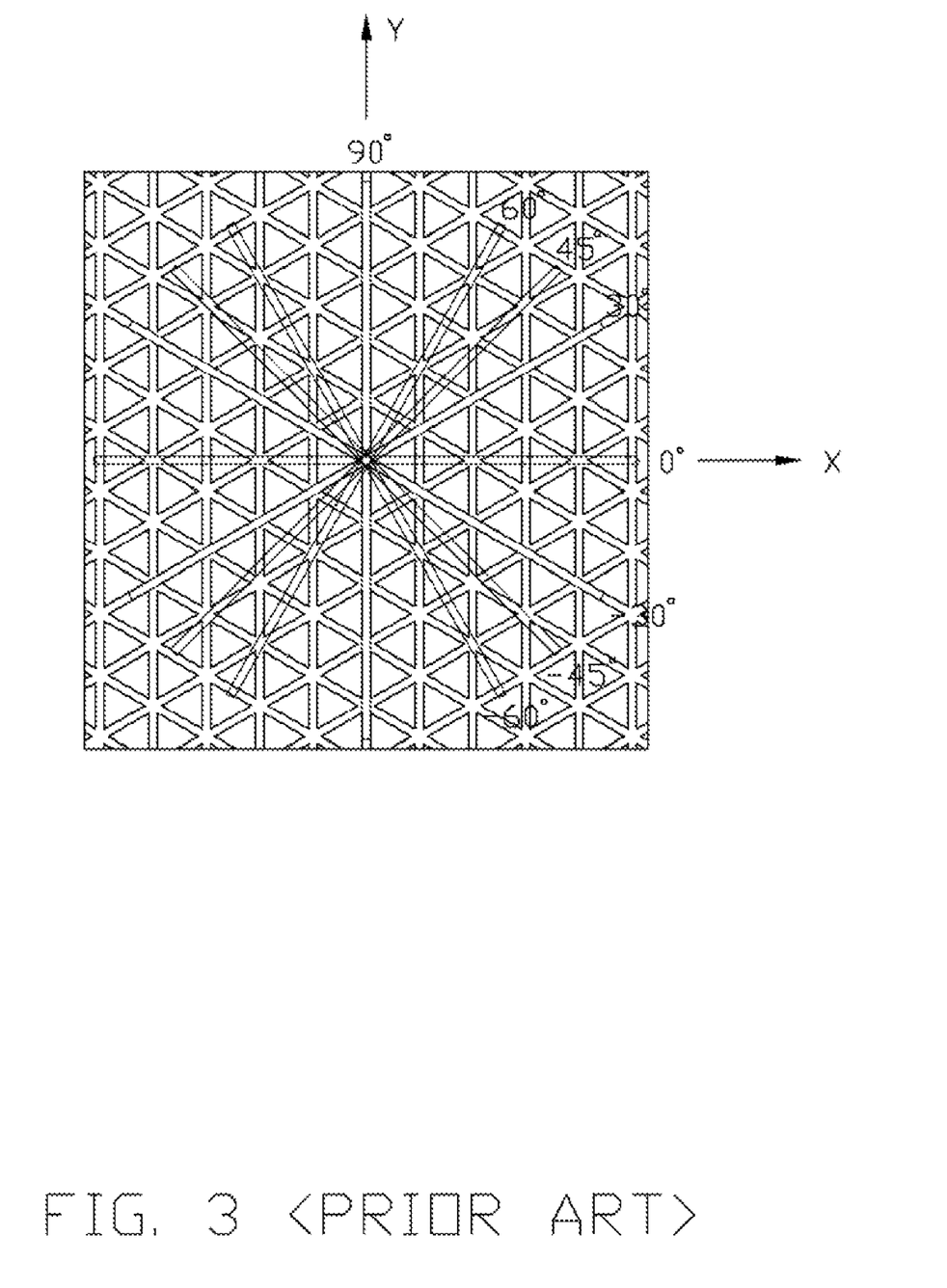
FIG. 3 is a top view of one embodiment of a circuit board, according to the prior art, with a conventional ground plane, and with straight line segments of signal traces mapped thereon.

In order to achieve a desired signal impedance of the circuit board, a ground plane formed by an array of same-sized equilateral hexagonal, square, or equilateral triangular tiles (as shown in FIGS. 1-3 respectively) is typically adopted. Each tile is formed by ground traces. The ground plane defines an X-axis along which a straight line segment of a signal trace is arranged. Generally, each straight line segment of a signal trace is arranged on the signal plane at an angle of 0, 30, 45, 60, 90, −30, −45 or −60° relative to the X-axis of the ground plane (as shown in FIGS. 1-3). The ground traces are also arranged at angles of 0, 30, 45, 60, 90, −30, −45 or −60° relative to the X-axis of the ground plane. In designing a PCB using the preceding arrangement, some line segments of a signal trace will cross ground traces of the ground plane at an angle causing only slight variation in impedance of the signal trace. However, to the detriment of signal trace performance, some portion or portions of a signal trace line segment will be coincident with a ground trace or traces of the ground plane, causing the impedance of that portion or portions of the signal trace line segment to be greatly reduced. Thus, the impedance of the signal trace will vary unevenly and affect signal quality.

Figure 4:
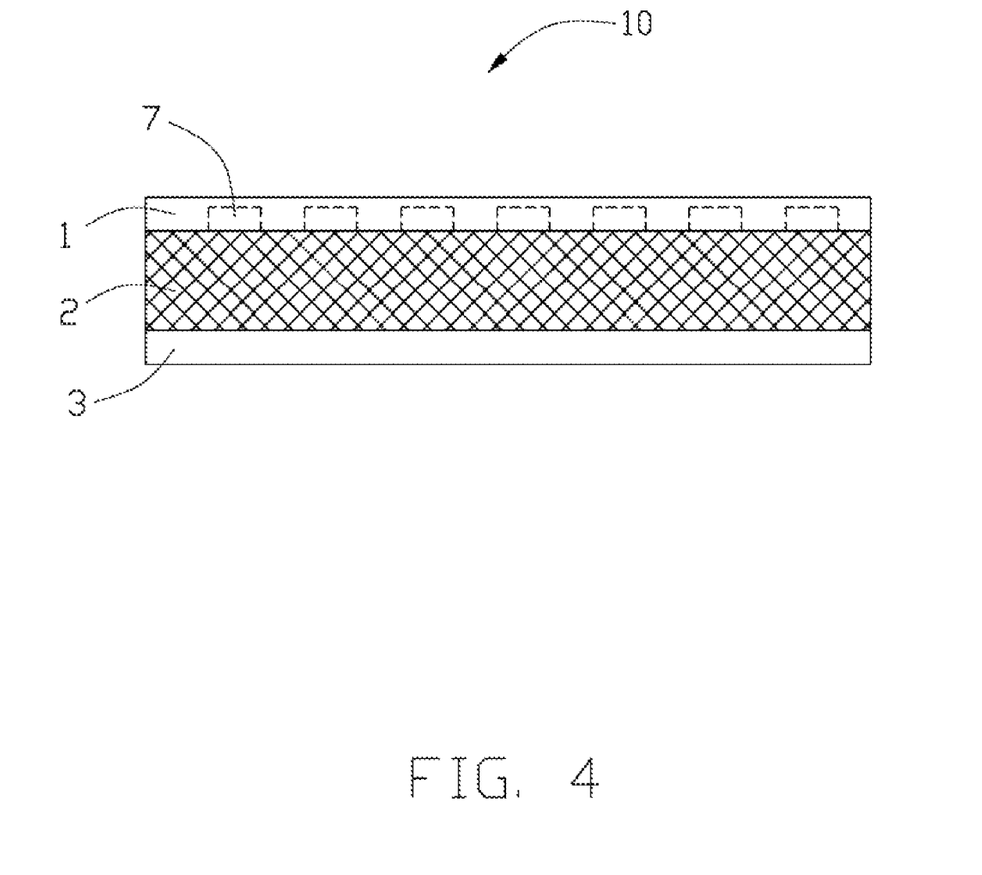
FIG. 4 is a cutaway view of a circuit board in accordance with one embodiment, including a signal layer with a plurality of signal traces arranged thereon, and a ground plane, and a media layer disposed therebetween.

FIG. 4 shows a circuit board 10 with a ground plane 3 for improving signal quality. The circuit board 10 in accordance with one embodiment includes a signal plane 1 with a plurality of signal traces 7 arranged thereon and a ground plane 3 for a plurality of ground traces arranged thereon. Each signal trace 7 includes a plurality of straight line segments. A media layer 2 is disposed between the signal layer 1 and the ground plane 3.

Figure 5:
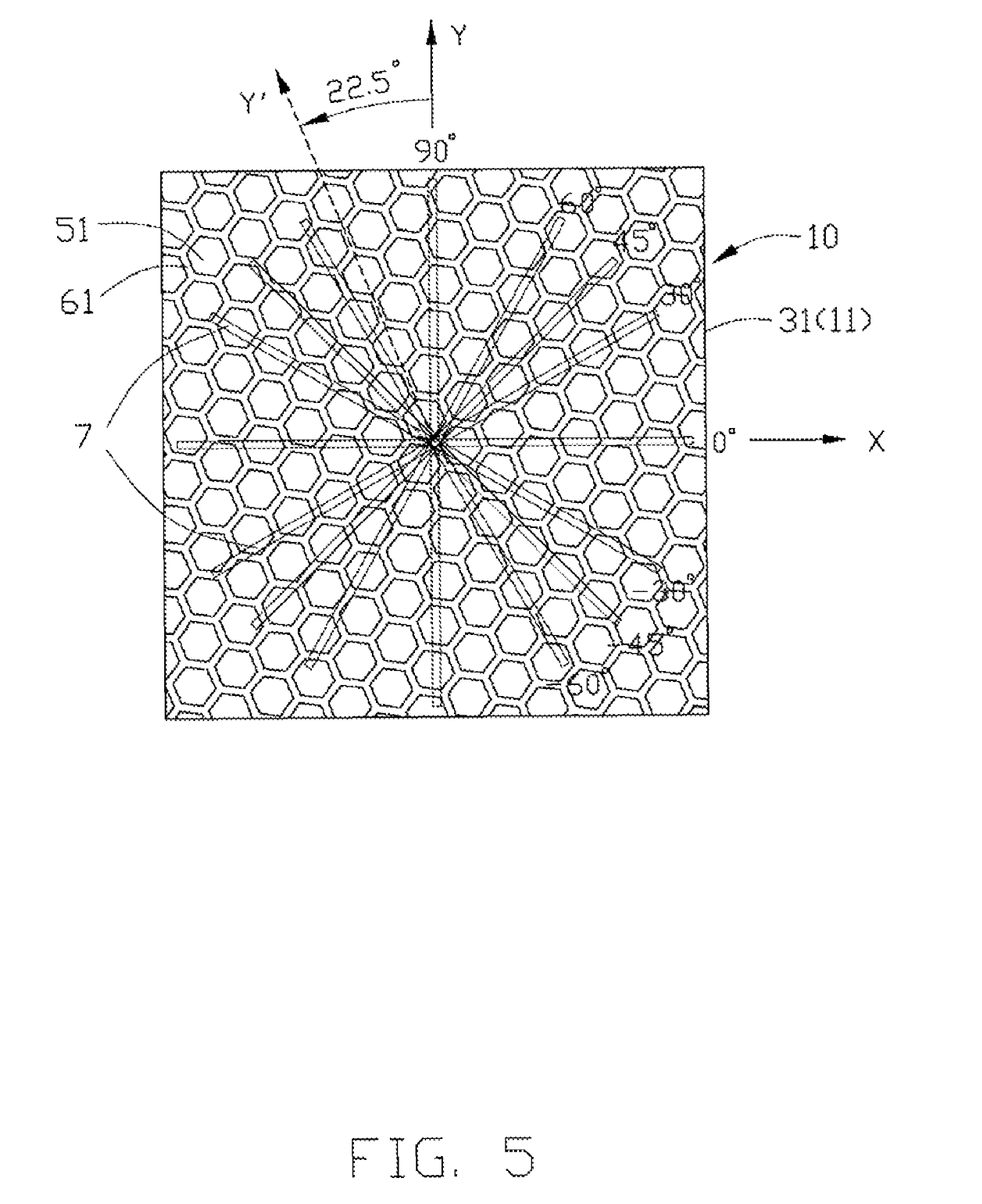
FIG. 5 is a top view of one embodiment of a circuit board with an improved ground plane, and with straight line segments of signal traces mapped thereon.

Referring to FIGS. 5-11, the circuit board 10 includes a plurality of sides 11. Referring to FIG. 5, a ground plane 31 of the circuit board 10 in accordance with one embodiment is shown. The ground plane 31 includes a plurality of same-sized tiles 51 connected in an array. Each tile 51 is a polygon delimited by six equal straight ground traces 61 connected consecutively end-to-end, forming an equilateral hexagonal tile. The ground plane 31 defines an X-axis along which a straight line segment of a signal trace 7 is arranged. A Y-axis of the ground plane 31 is perpendicular to the X-axis and parallel to one side 11 of the circuit board 10. A straight line passing through one straight ground trace 61 of each tile 51 is designated as a Y'-axis of the tile 51. In the present embodiment, the Y'-axis of each tile 51 is rotated 22.5° relative to the Y-axis of the ground plane 31. Thus, the ground traces 61 are oriented on the ground plane 31 at angles of 22.5, 52.5, 67.5, 112.5, −7.5, −22.5, or −37.5° relative to the X-axis of the ground plane 31. Each straight line segment of the signal traces 7 is arranged on the signal plane 1 at an angle of 0, 30, 45, 60, 90, −30, −45 or −60° relative to the X-axis of the ground plane 31. Thus, different portions of each line segment of a signal trace 7 mapped on the ground plane 31 are at an angle of at least 7.5° relative to any given ground trace they cross. With this arrangement, interaction between the ground traces and the signal traces is minimized to reduce impedance differences of the signal traces and cause the impedance of segments of the signal traces to vary evenly, thereby greatly improving signal quality. The ground traces 61 on the ground plane 31 may be oriented at other angles relative to the ground plane 31 to ensure segments of the signal traces 7 are not coincident with the ground traces 61.

Figure 6:
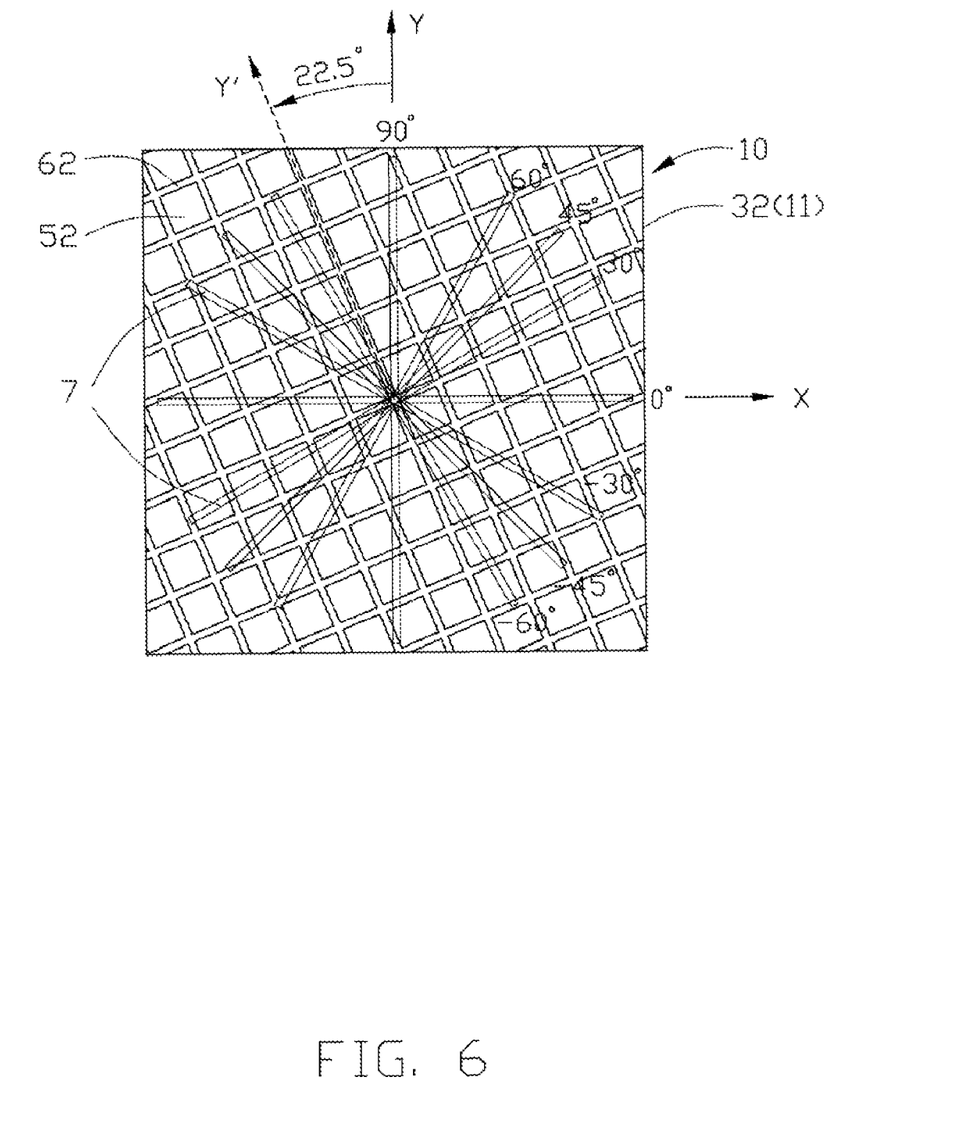
FIG. 6 is a top view of one embodiment of a circuit board with an improved ground plane, and with straight line segments of signal traces mapped thereon.

Referring to FIG. 6, a ground plane 32 of the circuit board 10 in accordance with one embodiment is shown. The ground plane 32 of the second embodiment is similar to that of FIG. 5, but each tile of the present embodiment is a polygon delimited by four equal straight ground traces 62 connected consecutively end-to-end, forming a square tile. A Y'-axis of each tile 52 is defined by a straight line passing through one straight ground trace 52 of the square tiles. The Y'-axis of each tile is rotated 22.5° relative to the Y-axis of the ground plane 32.

Figure 7:
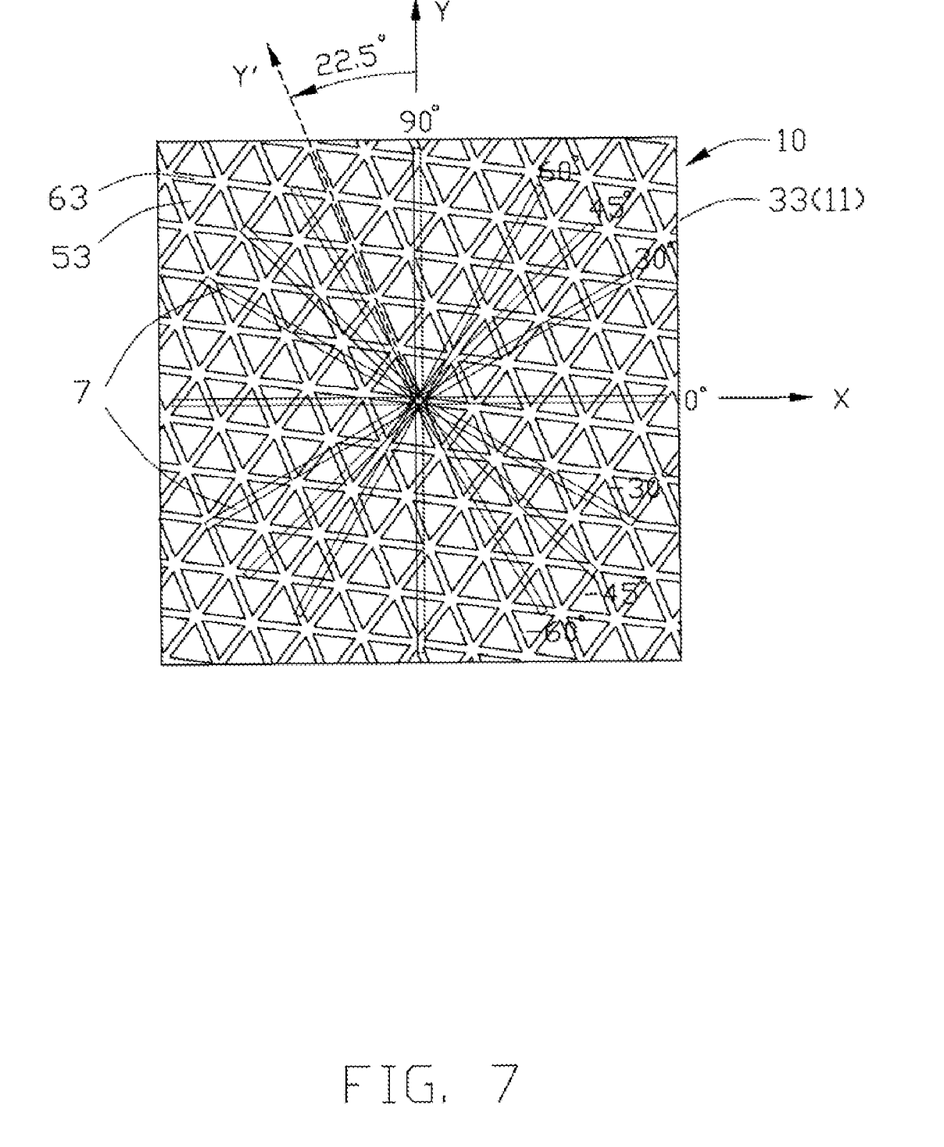
FIG. 7 is a top view of one embodiment of a circuit board with an improved ground plane, and with straight line segments of signal traces mapped thereon.

Referring to FIG. 7, a ground plane 33 of the circuit board 10 in accordance with one embodiment is shown. The ground plane 33 of the third embodiment is similar to that of FIG. 5, but each tile 53 of the present embodiment is a polygon delimited by three equal straight ground traces 63 connected consecutively end-to-end, forming a triangular tile. A Y'-axis of each tile 53 is defined by a straight line passing through one straight ground trace of the triangular tiles. The Y'-axis of each tile is rotated 22.5° relative to the Y-axis of the ground plane 33.

The tiles of the ground plane can be other polygonal shapes formed by ground traces oriented on the ground plane at angles to ensure segments of the signal traces are not coincident with the ground traces.

Figure 8:
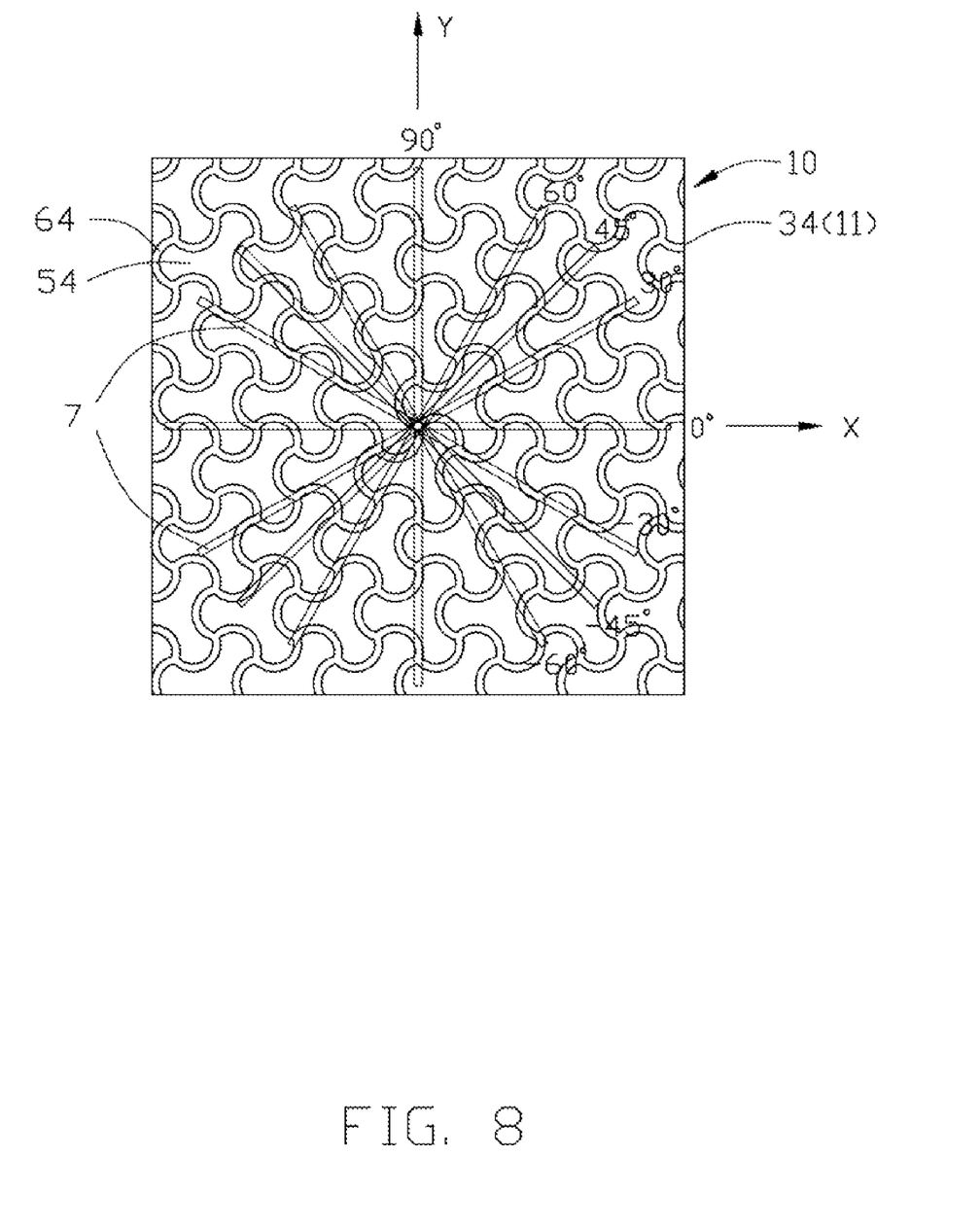
FIG. 8 is a top view of one embodiment of a circuit board with an improved ground plane, and with straight line segments of signal traces mapped thereon.

FIG. 8 shows a ground plane 34 of the circuit board 10 in accordance with one embodiment. In this embodiment, the ground plane 34 includes a plurality of same-sized and generally triangular tiles 54 with rounded convex corners and rounded concave sides. Each tile 54 is formed by curved ground traces 64.

Figure 9:
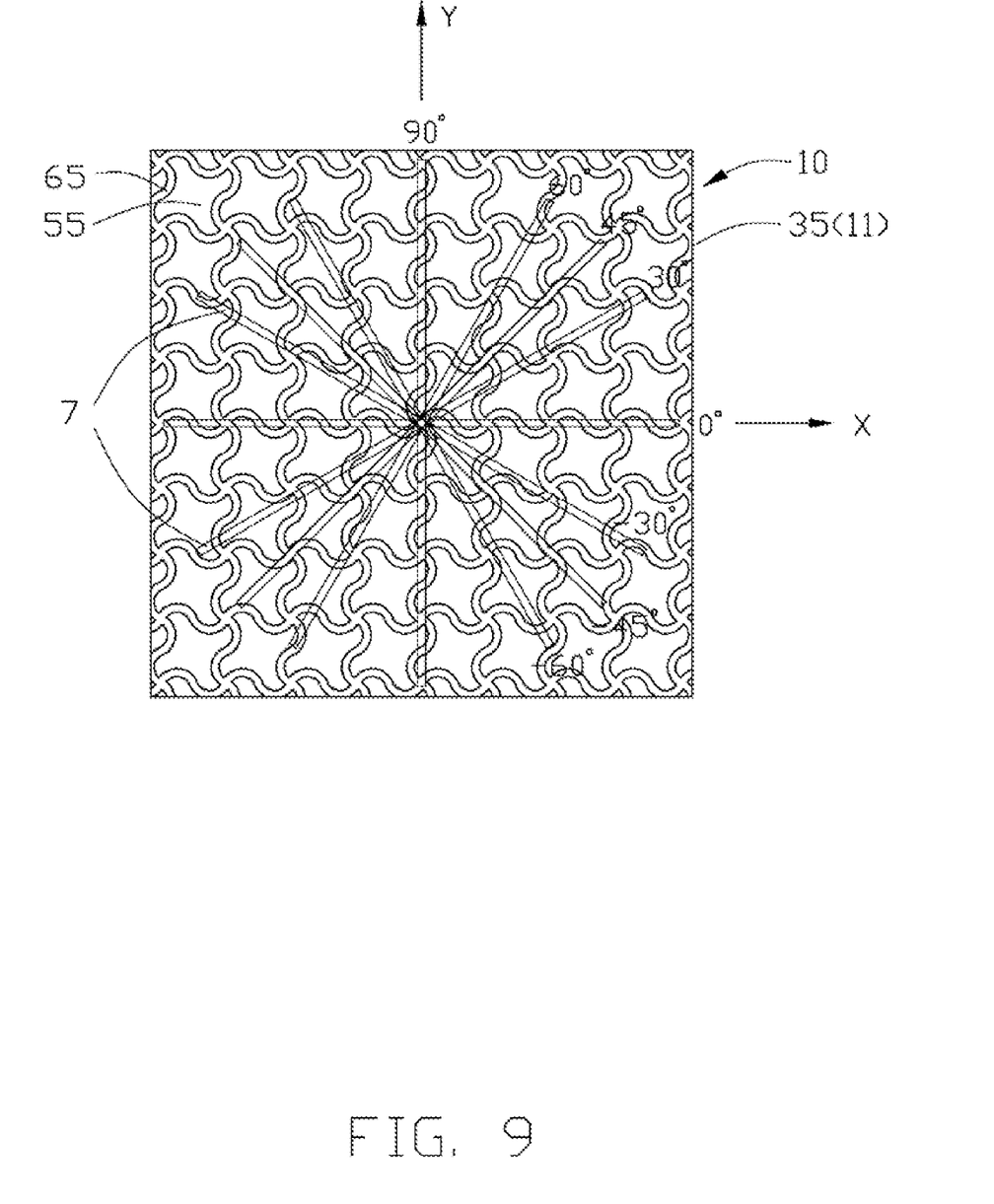
FIG. 9 is a top view of one embodiment of a circuit board with an improved ground plane, and with straight line segments of signal traces mapped thereon.

FIG. 9 shows a ground plane 35 of the circuit board 10 in accordance with one embodiment. In this embodiment, the ground plane 35 includes a plurality of same-sized and generally square tiles 55 with wavy sides. Each tile 55 is formed by curved ground traces 65.

Figure 10:
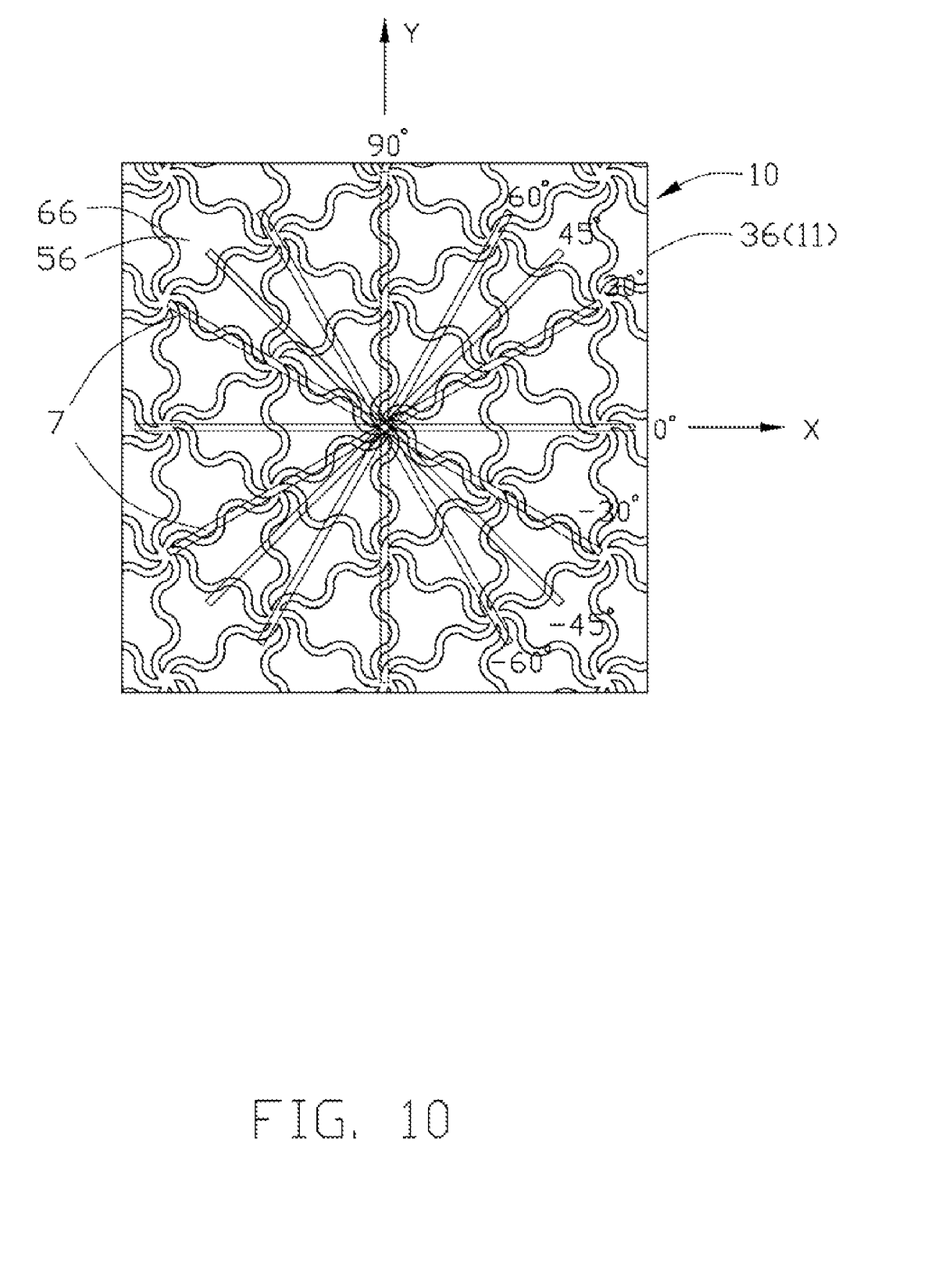
FIG. 10 is a top view of one embodiment of a circuit board with an improved ground plane, and with straight line segments of signal traces mapped thereon.

Referring to FIG. 10, which shows a ground plane 36 of the circuit board 10 in accordance with one embodiment. In this embodiment, the ground plane 36 includes a plurality of same-sized and generally triangular tiles 56 with wavy sides. Each tile 56 is formed by curve ground traces 66.

Accordingly, different portions of each line segment of a signal trace mapped on the ground plane will cross any given ground trace at a similar angle since the tiles are formed by curved ground traces. With this arrangement, interaction between the ground traces and the signal traces is minimized to reduce impedance differences of the signal traces and cause the impedance of segments of the signal traces to vary evenly, thereby greatly improving signal quality. The tiles of the ground plane may be formed in other shapes by curved ground traces.

Figure 11:
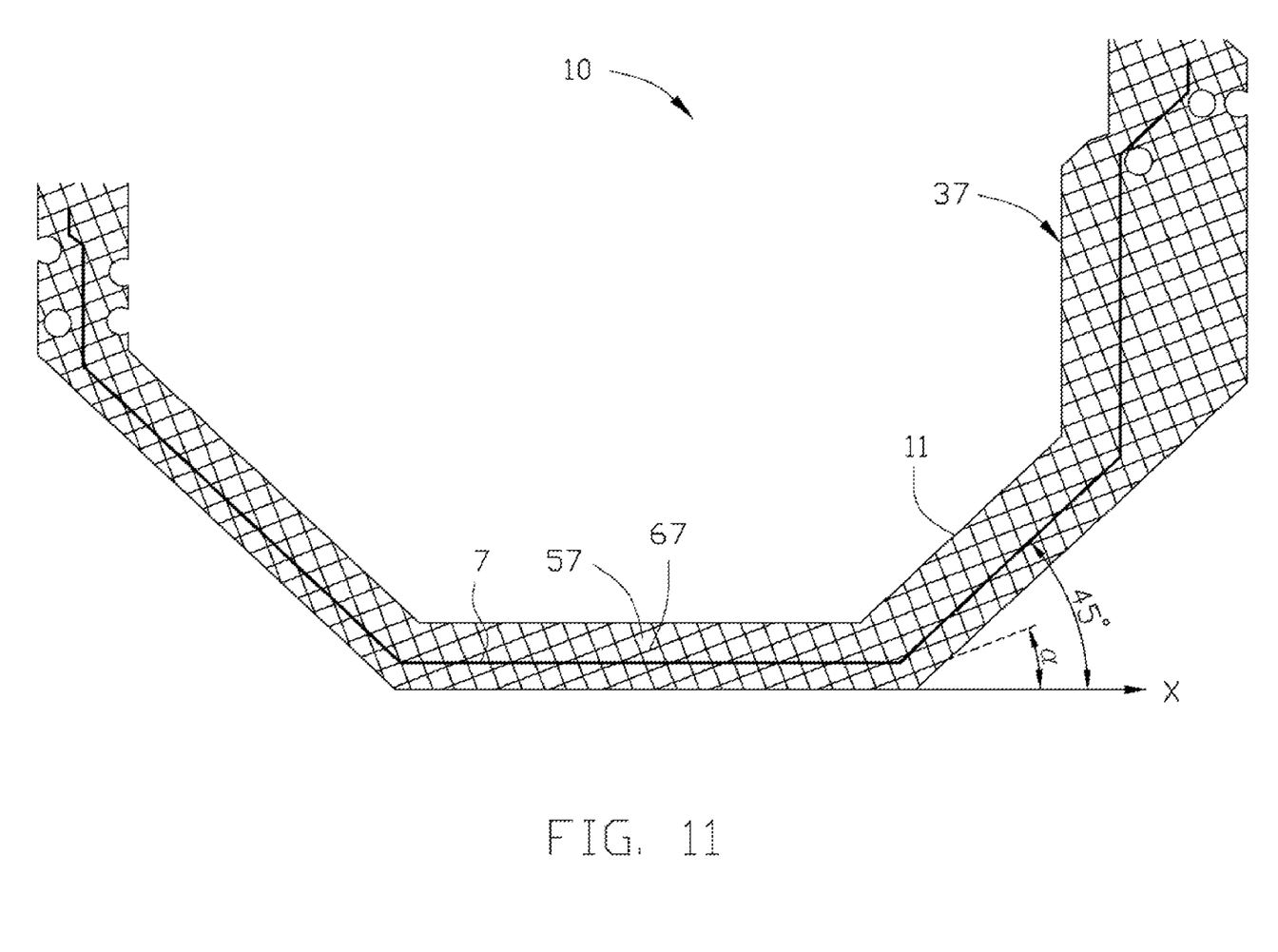
FIG. 11 is a top view of a flexible printed circuit (FPC) board with a ground plane in accordance with one embodiment, and with straight line segments of a signal trace mapped on the ground plane.

Referring to FIG. 11, in one embodiment, the circuit board 10 is a flexible printed circuit (FPC) board having a plurality of sides 11. An extending direction of one side 11 of the FPC is determined as the X-axis. The one side 11 of the FPC board 10 is characterized here as the determined side of the circuit board. In some embodiments, the line segments of the signal trace 7 may be arranged on the signal plane of the circuit board at 0, 45, or 90° relative to the X-axis (determined side of the circuit board). One of the ground traces 67 of each tile 57 is arranged at an angle α relative to the X-axis. In one embodiment, the ground trace tiles 57 are square. In another embodiment, the ground trace tiles 57 are rectangular. In other embodiments, the ground trace tiles 57 may form other polygons with equilateral sides of the same shape and size.

The following tables show impedance of different signal trace line segments when one of the ground traces of each tile is arranged at 0, 7, 10, 12.5, 17.5, 20, and 22.5° relative to the X-axis. The current embodiment illustrates the signal trace line segments arranged at 0 and 45° relative to the X-axis. That is, the angle between the signal trace line segments and the ground traces are respectively arranged at 0, 7, 10, 12.5, 17.5, 20, 22.5, 25, 27.5, 32.5, 35, 38, and 45°. The results are obtained via 3D electromagnetic software HFSS and a software HSPICE for simulating the impedance of signal traces. A 3D model of signal trace, dielectric material, mesh ground traces is created with specified angles; material properties and boundary conditions of the wave port are assigned. The software HSPICE simulates and obtains the corresponding impedance.

| Signal trace angle [degree] | Signal trace impedance [ohm] | Ground trace angle[°] | | | | | | |
|---|---|---|---|---|---|---|---|---|
| | | 0 | 7 | 10 | 12.5 | 17.5 | 20 | 22.5 |
| 0 | Max | 42.17 | 58.92 | 65.74 | 58.58 | 58.20 | 57.53 | 58.11 |
| | Min | 41.51 | 50.92 | 57.96 | 53.41 | 55.92 | 57.07 | 57.53 |
| 45 | Max | 62.11 | 57.90 | 65.74 | 56.84 | 58.46 | 58.23 | 58.11 |
| | Min | 61.36 | 55.62 | 57.96 | 55.49 | 57.30 | 56.61 | 57.53 |
| Average impedance [ohm] | | 51.81 | 54.92 | 61.85 | 56.00 | 57.19 | 57.42 | 57.82 |
| Deviation [(Max-Average/Average)*100%] | | 19.88% | 7.29% | 6.29% | 4.61% | 2.22% | 1.41% | 0.50% |

The table shows that when one of the ground traces of each tile is arranged at 0° relative to the X-axis, and the line segments of the signal traces are respectively arranged at 0 and 45° to the X-axis, that is, the line segments respectively passing through one of the ground traces of each tile and a diagonal line of the square tile, the impedance between the line segments deviates greatly. When the ground traces of the tile are arranged at an angle other than 0°, that is, the line segments of the signal traces avoid overlapping the ground traces of the tile and a diagonal line of the square tile, the impedance difference between the line segments is greatly decreased.

As shown in the table, when one of the ground traces of each tile is arranged at 22.5° relative to the X-axis (the determined side of the circuit board), the signal trace impedance between the signal trace line segments arranged at 0° relative to the X-axis (the determined side of the circuit board) and the signal trace line segments arranged at 45° relative to the X-axis (the determined side of the circuit board) deviates within 0.5%, which shows a most excellent effect to improve the signal quality. That is, when the angle between the ground traces and the signal trace line segments reaches 22.5°, the signal trace will exhibit superior signal quality. In detail, when one of the ground traces of each tile is angled from 12.5 to 22.5° relative to the X-axis (the determined side of the circuit board), the signal trace impedance between the signal trace line segments which are arranged at 0° relative to the X-axis (the determined side of the circuit board) and the signal trace line segments which are arranged at 45° relative to the X-axis (the determined side of the circuit board) deviates within 5%. That is, when the angle between the ground traces and the signal trace line segments are angled from 12.5 to 32.5 (22.5±10)°, the signal trace impedance between the signal trace line segments which are arranged at 0° relative to the X-axis (the determined side of the circuit board) and the signal trace line segments which are arranged at 45° (the determined side of the circuit board) relative to the X-axis deviates within 5%, which may meet a specific requirement for the circuit board. The impedance of the signal trace line segments arranged at different angles relative to the X-axis varies in a slight impedance value range, to ensure that the circuit board has good signal quality.

Figure 12:
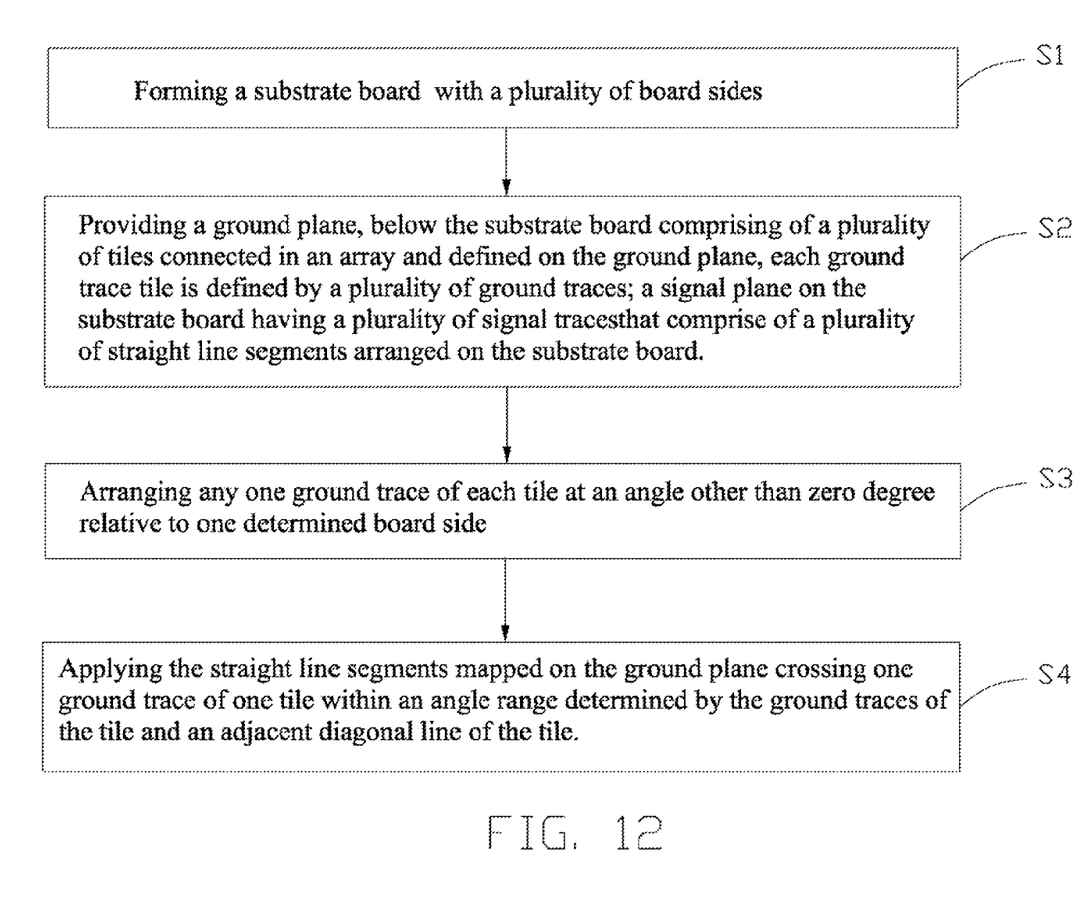
FIG. 12 and FIG. 13 are flow charts of methods for laying out circuit boards.

Referring to FIG. 12, a method for arranging a circuit board in accordance with one embodiment is illustrated. The method is described as follows.

In step S1, forming a substrate board with a plurality of board sides.

In step S2, providing a ground plane, below the substrate board comprising of a plurality of tiles connected in an array and defined on the ground plane, each ground trace tile defined by a plurality of ground traces; a signal plane on the substrate board having a plurality of signal traces that comprise of a plurality of straight line segments arranged on the substrate board. In one embodiment, the tiles are arranged in square or rectangular.

In step S3, arranging any one ground trace of each tile at an angle other than zero degree relative to one determined board side.

In step S4, applying the straight line segments mapped on the ground plane crossing one ground trace of one tile within an angle range determined by the ground traces of the tile and an adjacent diagonal line of the tile. In one embodiment, the one ground trace of the tile and the straight line segments of the signal traces are arranged at an angle range from 12.5 to 32.5°; and the line segments of the signal traces are arranged at about 0°, 45°, or 90° relative to the determined sides of the circuit board.

Figure 13:
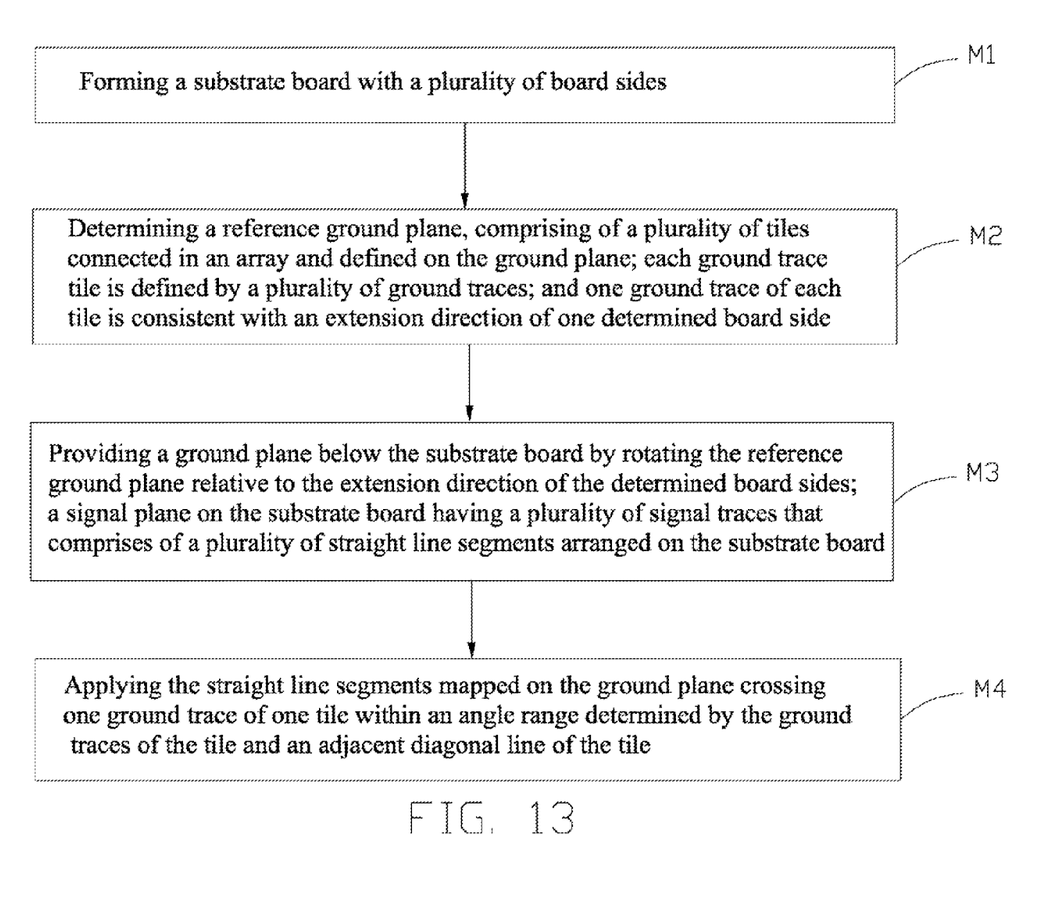

Referring to FIG. 13, a method for arranging a circuit board in accordance with another embodiment is illustrated. The method is described as follows.

In step M1, forming a substrate board with a plurality of board sides.

In step M2, determining a reference ground plane, comprising of a plurality of tiles connected in an array and defined on the ground plane; each ground trace tile is defined by a plurality of ground traces; and one ground trace of each tile is consistent with an extension direction of one determined board side (X-axis). In one embodiment, the tiles are arranged in square or rectangular.

In step M3, providing a ground plane below the substrate board by rotating the reference ground plane relative to the extension direction of the determined board sides; a signal plane on the substrate board having a plurality of signal traces that comprises of a plurality of straight line segments arranged on the substrate board. The reference ground plane is rotated at an angle value taken from an angle range from 12.5° to 32.5° relative to the determined board side. In one embodiment, the reference ground plane is rotated 22.5° relative to the determined board side.

In step M4, applying the straight line segments mapped on the ground plane crossing one ground trace of one tile within an angle range determined by the ground traces of the tile and an adjacent diagonal line of the tile. In one embodiment, the one ground trace of the tile and the straight line segments of the signal traces are arranged at an angle range from 12.5 to 32.5°; and the line segments of the signal traces are arranged at about 0°, 45°, or 90° relative to the determined sides of the circuit board.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

Depending on the embodiment, certain of the method steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for laying out a circuit board, comprising:
    forming a substrate board with a plurality of board sides;
    providing a ground plane, below the substrate board, comprising of a plurality of ground trace tiles connected in an array and defined on the ground plane, each ground trace tile defined by a plurality of ground traces; a signal plane on the substrate board having a plurality of signal traces that comprise of a plurality of straight line segments arranged on the substrate board;
    arranging any one ground trace of each tile at an angle other than zero degrees relative to one determined board side;
    applying the straight line segments mapped on the ground plane crossing one of the plurality of ground traces within an angle range determined by the ground traces of the tile and an adjacent diagonal line of the tile, so as to minimize interaction between the ground traces and the signal traces and reduce impedance differences of the signal traces; and
    applying one of the plurality of ground trace tiles and the straight line segments of the signal traces at an angle movable in a range from 22.5° to 32.5°.

2. The method for laying out a circuit board of claim 1, further comprising laying out the tiles of the ground plane in a square array or a rectangular array.

3. The method for laying out a circuit board of claim 2, further comprising applying the line segments of the signal traces at about 0°, 45°, or 90° relative to the determined sides of the circuit board.

4. A method for laying out a circuit board, comprising:
    forming a substrate board with a plurality of board sides;
    determining a reference ground plane having a plurality of ground trace tiles connected in an array and defined on the ground plane, each ground trace tile defined by a plurality of ground traces, any one ground trace of each tile consistent with an extension direction of one determined board side;

providing a ground plane below the substrate board by rotating the reference ground plane relative to the extension direction of the determined board side; a signal plane on the substrate board having a plurality of signal traces that comprises of a plurality of straight line segments arranged on the substrate board; and applying the straight line segments mapped on the ground plane crossing one ground trace of one tile within an angle range determined by the ground traces of the tile and an adjacent diagonal line of the tile, so as to minimize interaction between the ground traces and the signal traces and reduce impedance differences of the signal traces;

wherein the reference ground plane is rotated at an angle relative to the determined board side, and the angle value is taken from an angle range from 12.5° to 32.5°; and the reference ground plane is rotated 22.5° relative to the determined board side.

5. The method for laying out a circuit board of claim 4, further comprising applying the one ground trace of the tile and the straight line segments of the signal traces at an angle range from 12.5° to 32.5°.

6. The method for laying out a circuit board of claim 5, further comprising laying out the tiles of the ground plane in a square array or a rectangular array.

7. The method for laying out a circuit board of claim 6, further comprising arranging the line segments of the signal traces at about 0°, 45°, or 90° relative to the determined sides of the circuit board.

8. A method for laying out a circuit board, comprising:
forming a substrate board with a plurality of board sides;
determining a reference ground plane having a plurality of ground trace tiles connected in an array and defined on the ground plane, each ground trace tile defined by a plurality of ground traces, each ground trace being wavy;
providing a ground plane below the substrate board by rotating the reference ground plane relative to the extension direction of the determined board side; a signal plane on the substrate board having a plurality of signal traces that comprises of a plurality of straight line segments arranged on the substrate board; and
applying the straight line segments mapped on the ground plane crossing one ground trace of one tile within an angle range determined by the ground traces of the tile and an adjacent diagonal line of the tile, so as to minimize interaction between the ground traces and the signal traces and reduce impedance differences of the signal traces; wherein the reference ground plane is rotated at an angle movable in a range from 22.5° to 32.5° relative to the determined board side.

\* \* \* \* \*